United States Patent [19]

Carnel

[11] Patent Number: 4,881,072
[45] Date of Patent: Nov. 14, 1989

[54] DEVICE FOR REMOTE METERING

[75] Inventor: Alain Carnel, Poitiers, France

[73] Assignees: Electricite de France, Paris; Service National and Enertec, Montrouge, both of France

[21] Appl. No.: 23,355

[22] Filed: Mar. 9, 1987

[30] Foreign Application Priority Data

Mar. 7, 1986 [FR] France .............................. 86 03271

[51] Int. Cl.[4] .............................................. H04Q 9/00
[52] U.S. Cl. ...................... 340/870.020; 340/870.190;
340/870.370; 340/651; 340/652; 324/519;
324/539; 371/20.1
[58] Field of Search .......... 340/870.02, 310 R, 870.16,
340/870.19, 870.39, 650-652, 870.37; 324/519,
539, 543; 371/22

[56] References Cited

U.S. PATENT DOCUMENTS

| | | | |
|---|---|---|---|
| 4,103,299 | 7/1978 | Swinehart | 340/650 |
| 4,439,764 | 3/1984 | York et al. | 340/870.02 |
| 4,571,691 | 2/1986 | Kennon | 340/870.02 |
| 4,683,472 | 7/1987 | Beling | 340/870.02 |
| 4,782,300 | 11/1988 | Bonaccio et al. | 340/650 |

Primary Examiner—Donald J. Yusko
Assistant Examiner—Tyrone Queen
Attorney, Agent, or Firm—Sughrue, Mion, Zinn, Macpeak & Seas

[57] ABSTRACT

A device for remote metering, comprising a meter (4) for measuring a consumption, a transmission circuit for transmitting information relating to quantities consumed, and consisting essentially of a modulating circuit (5,6) and of a bifilar line (3), and a counter circuit for counting sets of information. The modulating circuit comprises a capacitive network (6) and at least one switch (5) which is actuated by the meter and which is capable of modifying the capacity of the capacitive network. The device further comprises a circuit (7,14) suitable for evaluating the value of the capacity of the transmission circuit, and thus for distinguishing two states of the modulating circuit and one state of a fault in the line. Such a device is, in particular, usable for the remote metering of a consumption of gas or of electricity.

12 Claims, 5 Drawing Sheets

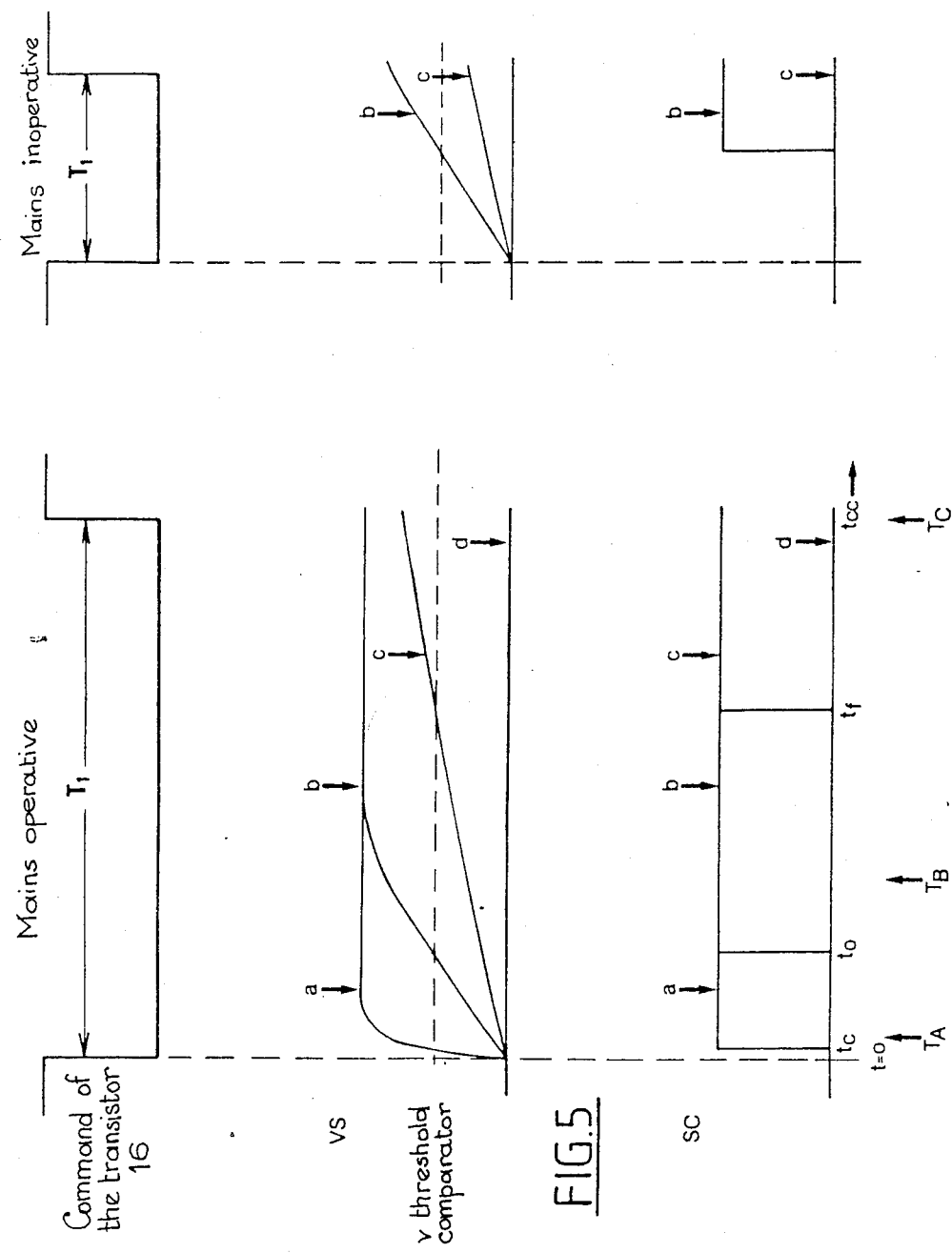

DEVICE FOR REMOTE METERING

BACKGROUND OF THE INVENTION

The invention relates to a device for remote metering which is, for example, usable to transmit to a remote location information relating to a volumetric consumption of a fluid ior to a consumption of electrical energy.

Such devices generally comprise means for measuring a consumption, means for transmitting a value consumed, and counting means, the transmitting means comprising a contact which is normally open (or normally closed) and which is connected to a bifilar transmission line and the closing (or opening) of which is commanded by a measuring device for a predetermined value consumed.

In traditional devices for remote metering of a consumption of gas, the measuring means comprise a mechanical totalizer, for example a cylinder, one turn of which corresponds to a certain volume of gas consumed. The transmission means comprise, in addition to a bifilar line, a modulator which takes, for example, the form of a REED bulb commanded at each complete turn of the mechanical totalizer, to supply information which represents the increments, in the course of time, of the said volume of gas, and which is transmitted via the bifilar line to means for numerical counting. These devices exhibit the difficulty that they do not permit the supervision of the line for the purpose of detecting a possible attempt at fraud or a breakdown, either by cutting of this line or by short-circuiting.

SUMMARY OF THE INVENTION

One of the objects of the invention is to provide a device for remote metering which, while performing its primary function, also periodically supplies indications of the condition of the line connecting the means for modulating the measurement signal to the counting means. The subject of the invention is thus a device for remote metering, comprising means for measuring a consumption, means for transmitting information, which transmission means are suitable for transmitting information relating to quantities consumed, and consisting essentially of modulating means and of a bifilar line, and means for counting these sets of information, which counting means are disposed at the other end of the line in relation to the measuring means, characterized in that the said modulating means comprise capacitive means connected to the bifilar line and switching means which are actuated by the measuring means to modify correlatively the value of the total capacitance which is represented, for a signal passing along the bifilar line, by the said capcitive means, and in that this device further comprises, on the counting means side, a current generator to apply a load current pulse to the bifilar line, and detecting means which are connected to the line and which are suitable for distinguishing, as a function of the rise time of the voltage on this line in response to the said current pulse, at least two states of the modulating means and one state corresponding to possible cutting and/or to a possible short-circuit of the transmission means.

According to an important feature of the invention, the rise time of the voltage on the bifilar line is evaluated by the said detecting means by a sampling of this voltage at at least three different instants ($t_A$, $t_B$, $t_C$) which are predetermined in relation to the instant of application of the said current pulse, and by comparison of the voltage values thus sampled with a determined threshold.

Another object of the invention is to provide a device for remote metering which can operate in an independent manner in the event of a cut in the supply during a long period of time.

The subject of the invention is likewise a device for remote metering as defined hereinabove and characterized in that it comprises an independent supply circuit, and in that it comprises a logic circuit for reduction of the duration of the load current pulse and for supplying the detecting means in the event of a mains failure.

Other features and advantages will become evident from the detailed description which will follow and which is given by way of example and undertaken with reference to the accompanying drawings, in which:

BRIEF DESCRIPTION OF THE DRAWINGS

FIG. 5 shows graphs of current and of voltage against time.

DETAILED DESCRIPTION OF A PREFERRED EMBODIMENT

Figure 1:
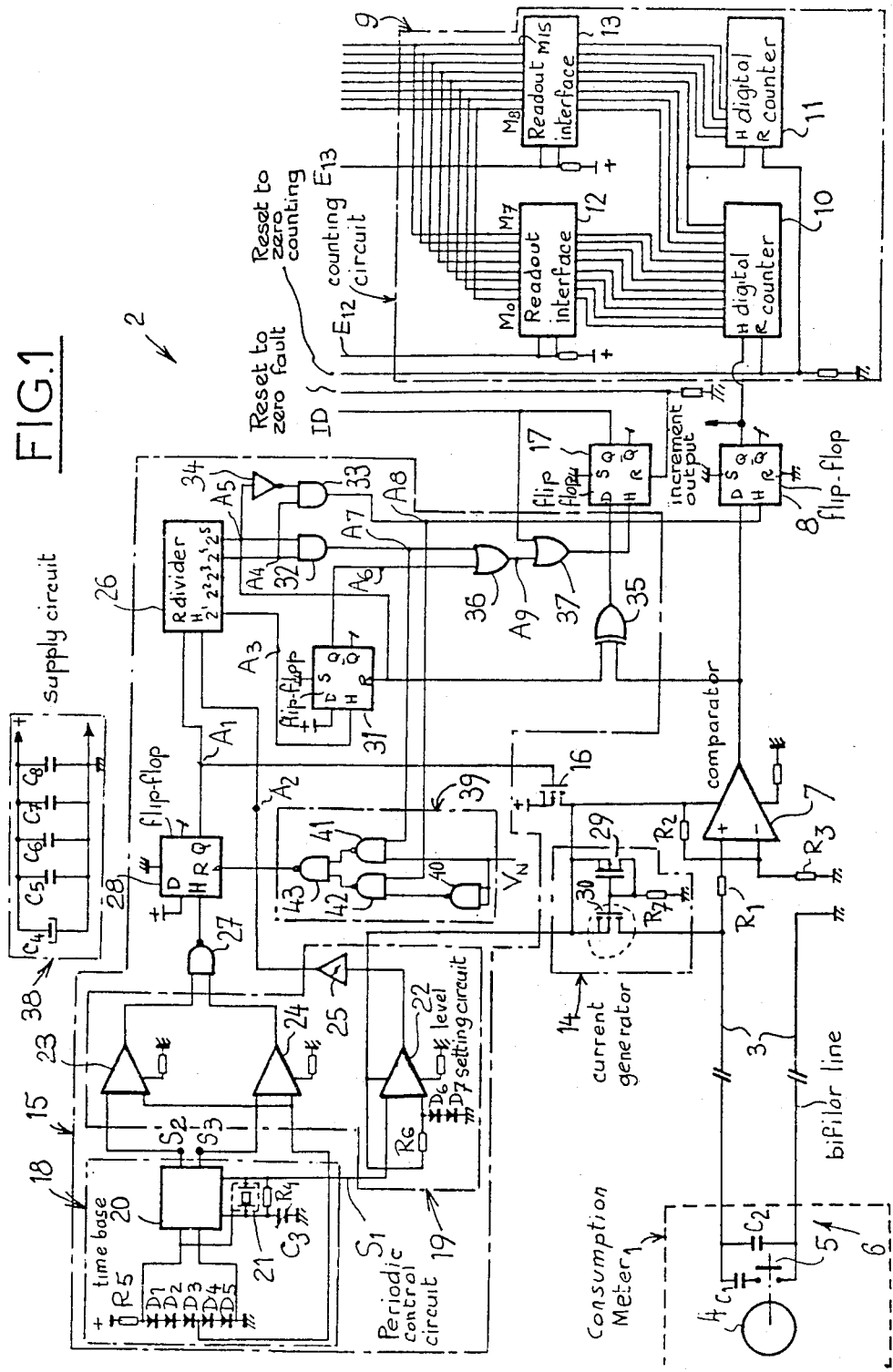
FIG. 1 is an electrical circuit diagram of the device for remote metering according to the invention.
Figure 2:
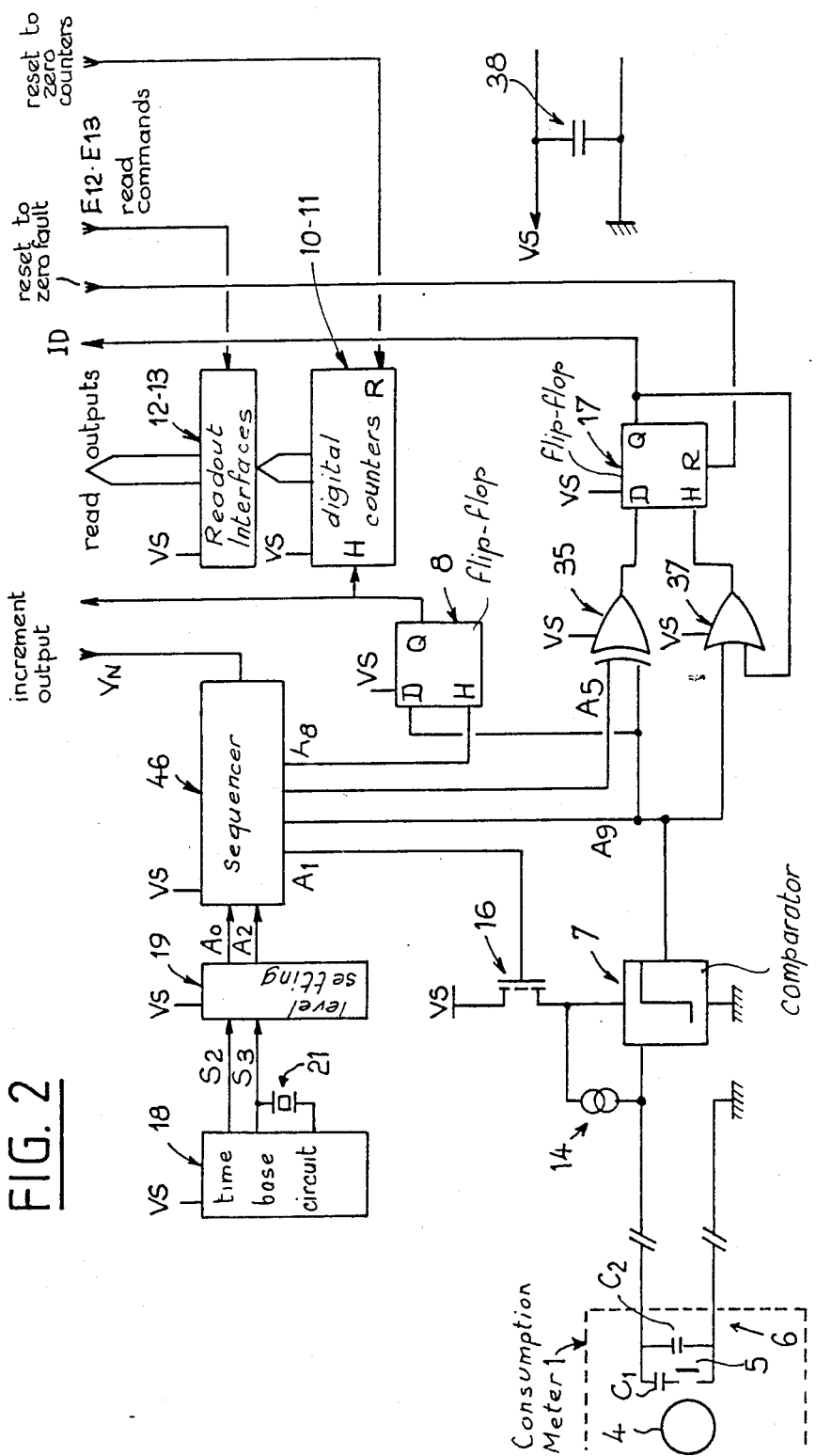
FIG. 2 shows a schematic diagram of the device, simplified in relation to the preceding figure.

FIG. 1 shows the electrical circuit diagram, and FIG. 2 the schematic diagram of a device for remote metering comprising a consumption meter 1 and remote means for counting 2 which are connected to the meter 1 by a bifilar line 3 permitting the transmission of information corresponding to a value consumed.

The meter 1, constituting a measuring means, is schematically represented by a cylinder 4 for totalizing consumption, which cylinder commands the opening and/or the closing of a contact 5, for each cylinder turn corresponding to a determined value consumed. The contact 5, constituting a switching means, is connected in series with a first capacitor $C_1$, and a second capacitor $C_2$ is connected in parallel with the assembly formed by these two components. The two terminals of the capacitor $C_2$ are each connected to one end of the conductors of the bifilar line 3. The capacitors $C_1$, $C_2$, which are designated overall by the reference 6, constitute capacitive means. The components 3, 5 and 6 constitute transmission means, the four possible states of which are:

line 3 cut,
contact 5 closed,
contact 5 open,
line 3 in short-circuit.

The other end of one of the conductors of the line 3 is connected to the earth terminal of a supply circuit 38, the other end of the other conductor being connected to the non-inverting input of a comparator 7 via a resistor $R_1$. The supply circuit 38 supplies the entire device for remote metering with a direct voltage $V_s$ of 3 to 5 volts. The supply terminal of the comparator 7 is connected via a resistor $R_2$ to the inverting input of this comparator, the latter input being connected to the earth terminal via a resistor $R_3$. The comparator 7 thus performs a comparison of the voltage at the ends of the line 3, which it receives on its non-inverting input, with a threshold voltage; the latter is regulated, in a known manner, by the resistance bridge $R_2$, $R_3$, in proportion to the supply voltage of the comparator 7, and applied to the inverting input of the latter.

The output of this comparator 7 is connected to the input D of a flip-flop 8, the output Q of which is connected to a counting circuit 9 constituted by two numerical counters 10, 11 and two read interface circuits 12, 13. The output Q is connected to the input H of the first counter 10, an output of which is connected to the input H of the second counter 11. The outputs of these two counters 10 and 11 are connected to the inputs of two interface circuits 12 and 13, in such a manner that these inputs receive a binary number of sixteen bits, corresponding to the counted number of closings or of openings of the contact 5, and thus to the number of times the value consumed for one turn of the cylinder 4. The first eight bits of the number are transmitted to the interface circuit 12, and the following eight bits to the interface circuit 13. The outputs $M_0$ to $M_7$ of the circuit 12 are connected respectively to the outputs $M_8$ to $M_{15}$ of the circuit 13 in order to constitute the outputs of the counting circuit 9. In this manner, when a read signal is applied to the command terminal $E_{12}$ of the circuit 12, the content of the counter 10 may be "read" on the outputs of the counting circuit 9, and when a read signal is applied to the command terminal $E_{13}$ of the circuit 13 the content of the counter 11 may be "read" on the outputs of the circuit 9, and the counters may be reset to zero by the count-reset-to-zero input connected to their inputs R. The counting circuit 9 is thus a sixteen-bit circuit permitting the counting and the storage in memory of a number ranging from zero to $2^{16}$, i.e. 65536. The reading and the processing of the datamay be effected, for example, by a microprocessor.

The detection of the four states of the transmission means 3, 5, 6 is effected by the comparator 7 as a function of the rise time of the voltage at the terminals of the line 3, in response to a current pulse generated by a current generator 14. This rise time of the voltage at the terminals of the line 3 is, in fact, dependent upon the value of the total capacitance of the line; now, this capacitance varies, depending on whether the line is sound or whether it is defective, for example cut in or in short-circuit and, for a sound line, this capacitance also varies according to whether the switching means 5 isolate the capacitor $C_1$ or, on the other hand, connect this capacitor in parallel with the capacitor $C_2$.

The output of the current generator 14 is connected to the end of the conductor of the line which corresponds to the non-inverting input of the comparator 7. A circuit 15 for the periodic command of a switch 16 of the comparator 7 and of the current generator 14 is likewise intended for the sequential triggering of the counting via the flip-flop 8 and the indication of a fault in the transmission means 3, 5, 6 via a flip-flop 17.

The command circuit 15 includes a time-base circuit 18, a level-setting circuit 19, and a logic circuit connected to the supply circuit of the current generator 14 and of the comparator 7 and to the flip-flops 8 and 17. This logic circuit will be described in detail hereinafter.

In FIG. 2, the sequencer 46 corresponds in terms of function to the command circuit 15 without the time-base circuit 18 and the level-setting circuit 19.

The time-base circuit 18 comprises an integrated circuit 20, two terminals of which are connected to two terminals of a quartz crystal 21, with which there is connected in parallel a resistor $R_4$, one of the terminals of which is connected to the earth terminal via a variable capacitor $C_3$ and to the positive supply terminal via a resistor $R_5$. The other terminal of the resistor $R_4$ constitutes a first output $S_1$ of the time-base circuit and gives a periodic signal of fixed frequency $f_1$. The supply terminals of the integrated circuit 20 are connected to the end electrodes of five diodes $D_1$, $D_2$, $D_3$, $D_4$, $D_5$ which can be biased with a low current and which are connected in series, the anode of the diode $D_1$ being connected to the positive supply terminal $V_s$ via the resistor $R_5$ and the cathode of the diode $D_5$ being connected to the earth terminal. Two outputs of the integrated circuit 20 constitute respectively a second output $S_2$ and a third output $S_3$ of the time-base circuit 18, which supply two signals which are of the same fixed frequency $f_2$ and which are offset in relation to one another by a half period.

The outputs $S_1$, $S_2$ and $S_3$ of the time-base circuit are connected to the level-setting circuit 19, which comprises three operational amplifiers 22, 23 and 24, which are connected in comparators. In this level-setting circuit, use is made of amplifiers utilizing CMOS technology, the bias current of which is adjustable via a resistor. The output $S_1$ is connected to the non-inverting input of the amplifier 22, the inverting input of which is connected, on the one hand, to the earth terminal via two diodes $D_6$ and $D_7$ connected in series and, on the other hand, via a resistor $R_6$, to its supply terminal and to the emitter of the supply transistor 16 constituting the supply circuit. The output of the amplifier 22 is connected to the input of a shaping circuit 25, the output of which is connected to the input H of a binary divider 26. The outputs $S_2$ and $S_3$ are respectively connected to the non-inverting inputs of the amplifiers 23 and 24, the inverting inputs of which are connected jointly to the junction point of the diodes $D_3$ and $D_4$ of the time-base circuit. The outputs of the two amplifiers 23 and 24 are connected to the inputs of a "NAND" gate 27, the output of which is connected to the input H of a flip-flop 28. The input D of this flip-flop is connected to the positive supply terminal $V_s$ and its output Q is connected to the input R of the divider 26 on the one hand and to the gate of the switching transistor 16 on the other hand. This output Q applies to the base of the transistor 16 a pulse of duration $t_1$ at time intervals $T_1$, in such a manner that the transistor is conductive during the duration $t_1$ of the pulse and so connects the supply terminals of the comparator 7 and of the current generator 14 to the positive supply terminal. The current generator is composed of transistors connected in a current mirror configuration, that is to say of an image transistior 29 having its base connected to the bases of five other transistors 30 connected in parallel (in order to simplify the figure, only one transistor has been shown and surrounded by a broken line). The source and substrate of the transistor 29 are connected jointly to the collector of the transistor 16, and its drain is connected on the one hand to its gate and to the gates of the five transistors 30 and on the other hand to the earth terminal via a resistor $R_7$. The drains of the five transistors 30 are connected jointly to the drain of the switching transistor 16 and their drains are connected jointly to the conductor of the line 3 which corresponds to the input of the comparator 7.

A first output $2^1$ of the divider 26 is connected to the input H of a flip-flop 31, the input D of which is connected to the positive supply terminal $V_s$.

A second output $2^4$ of the divider is connected to one of the inputs of a first "AND" gate 32 and of a second "AND" gate 33. A third output $2^5$ of the divider is connected to the input R of the flip-flop 31, to the other input of the first "AND" gate 32 and to the input of an inverter module 34, the output of which is connected to the other input of the second "AND" gate 33. This third output is likewise connected to one of the inputs of an "exclusive OR" gate 35, the other input of which is connected to the output of the comparator 7 and the output of which is connected to the input D of the flip-flop 17 for fault indication.

The output of the first "AND" gate 32 is connected to one of the inputs of an "OR" gate 36, the other input of which is connected to the output Q of the flip-flop 31 and the output of which is connected to one of the inputs of another "OR" gate 37. The other input of the "OR" gate 37 is connected to the output Q of the flip-flop 17 which is constitutes the fault-indication output ID. The output of the "OR" gate 37 is connected to the input H of the flip-flop 17, and the output of the second "AND" gate 33 is connected to the input H of the flip-flop 8. The flip-flop 17 may be reset to zero, by means of the fault reset-to-zero input connected to its input R, after "reading" of the output ID by a microprocessor, for example.

Advantageously, this counting circuit 2 comprises a circuit 38 for autonomous supply $V_s$ permitting safeguarding of the transmission of the consumption signal as well as the counting of the value consumed, in an operational mode with a reduced consumption of energy.

This circuit must permit independence of at least one hundred hours, during which the remote metering must be ensured. Thus, the supply circuit comprises a capacitor $C_4$, having a value of approximately 1 farad, and four capacitors $C_5$ to $C_8$ connected jointly in parallel. This circuit permits maintenance of the supply voltage between 5 and 3 volts for a period of approximately one hundred hours, the voltage of three volts being the minimum supply voltage of the CMOS circuits which are used.

An auxiliary source (not shown) of voltage $V_N$ equal to 5 V, supplied by the mains, recharges the capacitors of the independent supply circuit when the mains is operational.

In order to reduce the consumption of the remote metering circuit, the detection of faults, the principle of which will be explained hereinafter in connection with the description of the operation of the remote metering device, is not undertaken during operation with an independent supply. To this end, there is provided a logic circuit 39 for reduction of the duration $t_1$ of the output pulse of the flip-flop 28, as a function of the input signal $V_N$ indicating that the mains supply of the auxiliary source is operational. This signal is transmitted to the two inputs of a first "NAND" gate 40 and to one of the inputs of a second "NAND" gate 41, the other input of which is connected to the output of the first "AND" gate 32. The output of the first "NAND" gate 40 is connected to one of the inputs of a third "NAND" gate 42, the other input of which is connected to the output of the second "AND" gate 33. The outputs of the second "NAND" gate 41 and the third "NAND" gate 42 are connected respectively to the inputs of a fourth "NAND" gate 43, the output of which is connected to the input R of the flip-flop 28.

The operation of this remote metering device will now be described with reference to FIGS. 3, 4 and 5 and for a particular embodiment, in which the following principal components have been used:

| Category | Reference of the Components | Characteristics |
|---|---|---|
| Diodes | $D_1$ to $D_7$ | 1 N 4448 |
| Resistor | $R_4$ | 10 M 5% ¼ W |
|  | $R_5$ | 1.5 M |
|  | $R_2, R_3, R_6$ | 1 M |
|  | $R_{10}$ | 1K |
|  | $R_7$ | 4.64K 1% |
| Quartz crystal | 21 | 32768 Hz |
| Integrated circuits | 20 | PCA 1201 |
|  | 7, 22, 23, 24 | MO 409 |
|  | 8, 17, 28, 31 | MC 114013 B |
|  | 10, 11, 26 | MC 1 4040 B |
|  | 12, 13 | 74 HC 244 |
|  | 14, 16 (29, 30) | MO 405 |
|  | 25, 27 | MC 14084 B |
|  | 27, 32, 33 | MC 14081 B |
|  | 34, 35 | MC 14070 B |
|  | 36, 37 | MC 14071 B |
| Capacitors | $C_4$ | 1F 5.5 V |
|  | $C_3$ variable | 4/40 pF |
|  | $C_5$–$C_8$ | 47 nF 100 V ± 10% |

With the remote metering device according to the invention, counting and fault indication are carried out as a function of the value of the capacitance C of the capacitive means by comparison of the voltage at the terminals of the line 3 with a threshold voltage during the duration $t_1$ of the current pulse supplied by the current generator 14.

If the capacitance of the line 3 is designated as $C_C$, it is possible to define four possible states of the transmission means as a function of their output capacitance C:
line cut: $C = C_C$
contact 5 closed: $C = C_1 + C_2 = C_C$
contact 5 open: $C = C_2 + C_C$
line in short-circuit: the voltage at the terminals of the line remains close to zero.

It is possible, in this way, to define four rise times of the signal E applied to the comparator 7, corresponding to the four aforementioned cases, and these will be designated as $t_c$, $t_o$, $t_f$ and $t_{cc}$ respectively.

FIG. 5 shows the voltages $V_1$ and $S_c$ at the input and at the output of the comparator 7 in the four cases mentioned, with the mains operative and inoperative.

The table which is given hereinafter shows the values of these rise times (that is to say when the voltage $V_1$ at the input of the comparator 7 becomes greater than the threshold voltage V which is the threshold of this comparator and is close to Vs/2) for a cable having a length of thirty meters, ie. a maximum of $C_c = 30 \times 100$ pF $= 3$ nF. $C_1 = 116$ nF and $C_2 = 49$ nF. The value $t_{cc}$ (not shown) is infinite.

TABLE I

| $C$ tot (nF) | t nominal ($10^{-6}$s) | t minimal ($10^{-6}$s) | t maximal ($10^{-6}$s) | t sampling ($10^{-6}$s) |
|---|---|---|---|---|
| 3(Max) | $t_c = 7.5$ | $t_c = 0$ | $t_c = 12$ | $t_A = 30$ |
| 52 | $t_o = 130$ | $t_o = 76$ | $t_o = 207$ | $t_B = 240$ + |
| 168 | $t_f = 420$ | $t_f = 275$ | $t_f = 617$ | $t_C = 720$ |

In mains operations, the result of the comparison during the duration $t_1$ of each pulse is evaluated sequentially three times in order to determine the four possible states of the transmission means.

By selecting $t_1 = 720.10^{-6}s$ and $T_1 = 1$ s, the instants of evaluation $t_A$, $t_B$, $t_C$ are calculated with effect from the start of the pulse and are indicated in Table I. This operation is executed by successive operations of storage of the result (referred to as "samplings" hereinafter) in one or the other of the flip-flops 8 and 17 by means of the command circuit 15. These results will be analyzed as follows, for example every second, by a microprocessor:

first sampling at the instant $t_A$:
$V_1$ greater than V threshold = line cut
second sampling at the instant $t_B$:
$V_1$ greater than V threshold (with $V_1$ less than V threshold for the first) = contact open
third sampling at the instant $t_C$:
$V_1$ greater than V threshold (with $V_1$ less than V threshold for the first and the second) = contact closed
$V_1$ less than V threshold = line in short-circuit.

With these particular values for the capacitancies and the sampling times, any risk of overlap between the various times, and thus any risk of error in the analysis of the results, is avoided.

The values of the instants $t_A$, $t_B$, $t_C$ are calculated in order to take account of the uncertainties of the threshold voltage, the capacitancies $C_1$, $C_2$, $C_3$ and the current (minimum and maximum values).

The obtaining of these sampling times for the storage of the fault information and of the count will now be described with reference to the chronograms of FIGS. 3 and 4, for operation with mains supply and with independent supply respectively.

Figure 3:
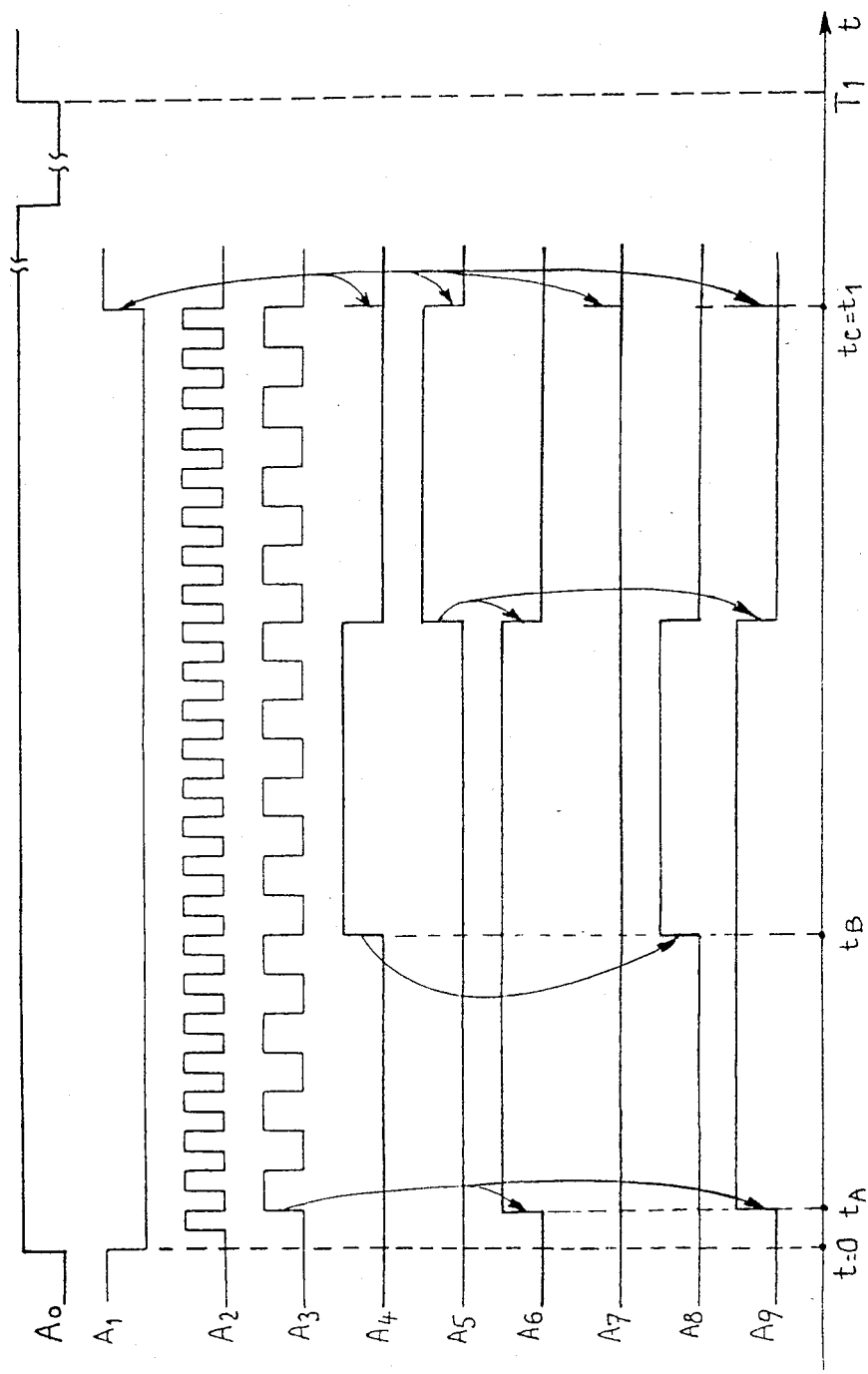
FIG. 3 shows a signal chronogram taken at different points of the device of FIG. 1, in operation with an external supply.
Figure 4:
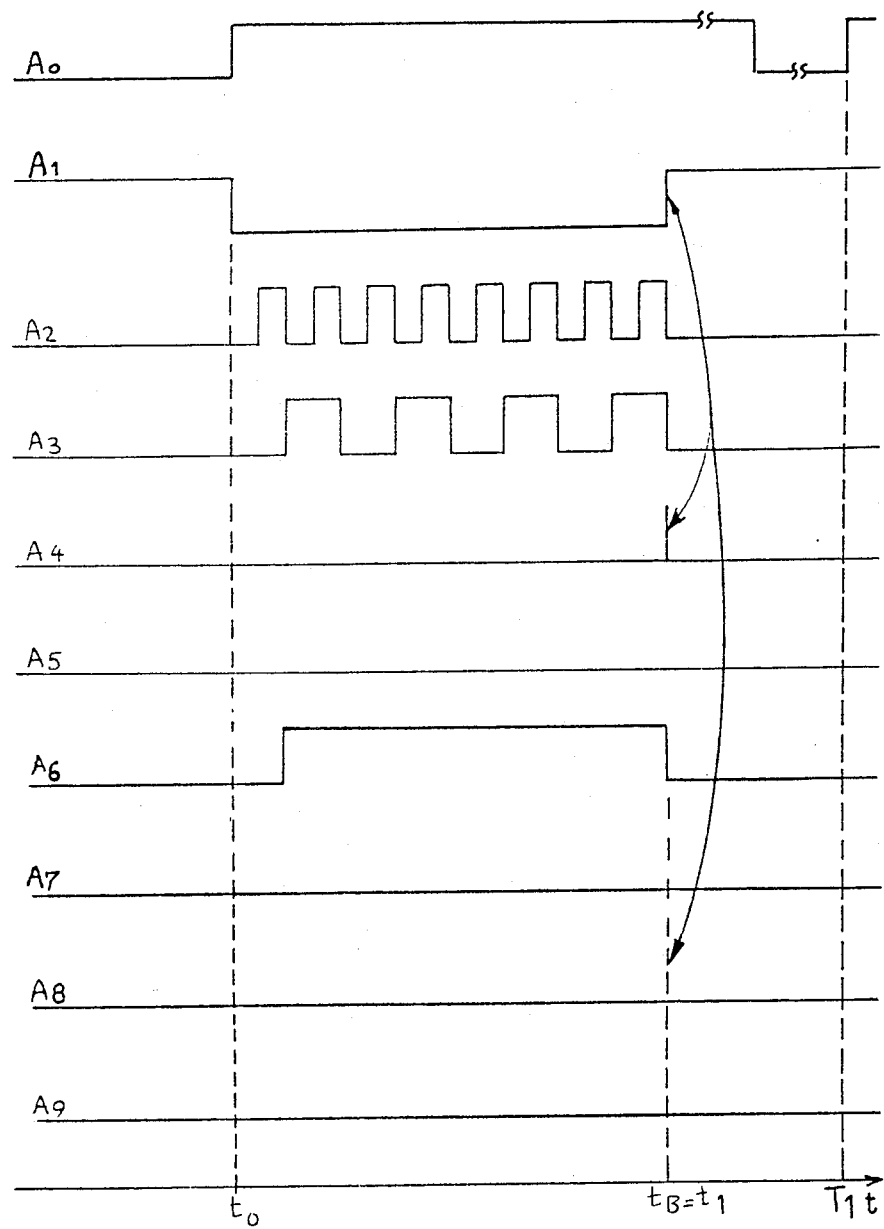
FIG. 4 shows a signal chronogram taken at various points of the device of FIG. 1, in operation with the independent supply.

The chronogram of FIG. 3 represents the signals present at different points $A_o$ to $A_9$ of the command circuit 15 (see FIG. 1) during the pulse generated by the circuits 18, 19, 27 and 28. The signal $A_o$ is the low-frequency signal generated by the time-base 18 and shaped by the circuit 19. The start of the signal $A_o$ is taken as the origin of the times $t = 0$ for the graphs of FIGS. 3 to 5. The signal $A_1$ represents the pulse triggered by the signal $A_o$ at the output Q of the flip-flop 28 and which is applied to the switching transistor 16 of the comparator 7 and of the current generator 14. During the duration $t_1$ of this pulse, the output of the comparator thus applies the value of the comparison $V_1$ in relation to V threshold to the input D of the flip-flop 8 and to the input of the "exclusive OR" gate 35.

The pulse is likewise at the input of the counter 26, which receives a clock signal $A_2$ of approximately 32 kHz. There are obtained at the three outputs of the counter 26 which are used the signals $A_3$, $A_4$, $A_5$ respectively and, via the flip-flop 31 and the logic gate 32, the intermediate signals $A_6$ and $A_7$.

By means of the gates 33, 34 and 36, the signal $A_8$ is obtained, which serves to trigger the second sampling at the time $t_B$ by the flip-flop 8 for the counting of an increment if the contact 5 is open, and the signal $A_9$ which, combined with the signal for fault indication by means of the gate 37, serves to trigger the first sampling and the third sampling at the times $t_A$ and $t_C$ by the flip-flop 17, in which case the count will not be meaningful.

The operation with independent supply will now be described with reference to the chronogram of FIG. 4.

The pulse $A_1$ at the output Q of the flip-flop 28 is triggered by the signal $A_o$, and its duration is reduced to $t_8$ by means of the logic circuit 39, in the absence of the mains supply signal, in such a manner that the signals $A_5$, $A_7$ and $A_9$ remain at zero. In this manner, the first sampling and the third sampling are not undertaken by the flip-flop 17, while the second sampling takes place at the time $t_B$ by virtue of the signal $A_8$. Thus, the counting is carried out and the result is stored in the counters 10 and 11, which will be able to be "read" by the microprocessor, for example, at the end of the interruption of the mains supply. As has been stated previously, the counters 10 and 11 have a capacitance which is sufficient to ensure counting during a period of at least one hundred hours.

The interface circuits 12 and 13 permit successive connection of the outputs of the counters 10 and 11 to the input of the microprocessor.

As will be seen hereinbelow, the consumption of energy by the device for remote metering according to the invention has shown that the independent supply itself also ensures counting during a period of at least one hundred hours:

Average consumption in operation with the mains supply:

$$I = 5 \; 10^{-6} A;$$

Average consumption in independent operation: on commencement of operation $V = 5$ V $$I = 4.3 \; 10^{-6} A;$$

and on termination of consumption $V = 3$ V $$I = 2.2 \; 10^{-6} A.$$

I claim:
1. Device for remote measuring, comprising measuring means for measuring a consumption, transmission means for transmitting information, which transmission means is suitable for transmitting information relating to quantities consumed, and consisting essentially of modulating means and of a bifilar line, said measuring means and said modulating means being connected to a first end of said bifilar line, and counting means for counting said information, which counting means is disposed at a second end of the line, characterized in that said modulating means comprises capacitive means (6) connected to the bifilar line and switching means (5) which is actuated by the measuring means (4) to modify correlatively the value of the total capacitance which is represented, for a signal passing along the bifilar line, by said capacitive means, and in that this device further comprises, on the counting means end of said bifilar line, a current generator (14) to apply a load current pulse to the bifilar line, and detecting means (7) which is connected to the line (3) and which is adapted for distinguishing, as a function of the rise time of the voltage on this line in response to said current pulse, at least two states of the modulating means and one state corresponding to possible cutting and/or to a possible short-circuit of the transmission means.

2. Device according to claim 1, characterized in that, said current pulse being applied at a given instant, said rise time of the voltage on the bifilar line is measured by the said detecting means by a sampling of said voltage at at least three different instants ($t_A$, $t_B$, $t_C$) which are predetermined in relation to the instant of application of the said current pulse, and by comparison of the voltage values thus sampled with a determined threshold.

3. Device for remote metering according to claim 1 or 2, characterized in that it further comprises means for supplying voltage to said current generator and said detecting means and in that the duration $t_1$ of the current pulse is equal to the duration of the supplying of voltage to the detecting means (7).

4. Device for remote metering according to claim 1 or 2, characterized in that the detecting means is constituted by a comparator (7) which is connected to the terminals of the bifilar line and the threshold voltage of which is fixed by means of the supply circuit (16) of the current generator and of said comparator.

5. Device for remote metering according to claim 4, characterized in that the counting means is constituted by a counting circuit (8,9) and a circuit for fault indication (17), which are connected to the output of the comparator (7) and triggered sequentially during each current pulse by means of a logic circuit.

6. Device for remote metering according to claim 1 or 2, characterized in that said device comprises an independent supply circuit (38) and means (39) for reducing the load current pulse in the event of mains failure.

7. Device for remote metering according to claim 5, characterized in that, in an independent operational mode, the logic circuit triggers only the counting circuit (8,9).

8. Device for remote metering according to claim 3, characterized in that the detecting means is constituted by a comparator (7) which is connected to the terminals of the bifilar line and the threshold voltage of which is fixed by means of the supply circuit (16) of the current generator and of said comparator.

9. Device for remote metering according to claim 3, characterized in that said device comprises an independent supply circuit (38) and means (39) for reducing the load current pulse in the event of mains failure.

10. Device for remote metering according to claim 4, characterized in that said device comprises an independent supply circuit (38) and means (39) for reducing the load current pulse in the event of mains failure.

11. Device for remote metering according to claim 5, characterized in that said device comprises an independent supply circuit (38) and means (39) for reducing the load current pulse in the event of mains failure.

12. Device for remote metering according to claim 11, characterized in that, in an independent operational mode, the logic circuit triggers only the counting circuit (8,9).

* * * * *